United States Patent

Taguchi et al.

Patent Number: 5,719,446
Date of Patent: Feb. 17, 1998

[54] MULTILAYER INTERCONNECT STRUCTURE FOR SEMICONDUCTOR DEVICE AND METHOD OF MANUFACTURING SAME

[75] Inventors: Mitsuru Taguchi, Tokyo; Keiichi Maeda; Hiroshi Suzawa, both of Kanagawa; Hidenori Kenmotsu, Tokyo; Teruo Hirayama, Kanagawa, all of Japan

[73] Assignee: Sony Corporation, Tokyo, Japan

[21] Appl. No.: 797,925

[22] Filed: Feb. 12, 1997

Related U.S. Application Data

[63] Continuation of Ser. No. 557,681, Nov. 13, 1995, abandoned, which is a continuation of Ser. No. 262,024, Jun. 17, 1994, abandoned.

[30] Foreign Application Priority Data

Jun. 23, 1993 [JP] Japan .................. 5-173701

[51] Int. Cl.⁶ .................. H01L 29/41
[52] U.S. Cl. .................. 257/751; 257/758; 257/763; 257/764; 257/765; 257/774; 257/915
[58] Field of Search .................. 257/750, 751, 257/763, 764, 765, 773, 774, 915, 758

[56] References Cited

U.S. PATENT DOCUMENTS

| | | | |
|---|---|---|---|
| 4,816,424 | 3/1989 | Watanabe et al. | 257/764 |
| 4,937,652 | 6/1990 | Okumura et al. | 257/915 |
| 4,987,562 | 1/1991 | Watanabe | 257/751 |
| 5,202,579 | 4/1993 | Fujii et al. | 257/751 |
| 5,278,448 | 1/1994 | Fujii | 257/765 |
| 5,313,100 | 5/1994 | Ishii et al. | 257/751 |
| 5,317,187 | 5/1994 | Hindman et al. | 257/659 |
| 5,341,026 | 8/1994 | Harada et al. | 257/764 |
| 5,356,836 | 10/1994 | Chen et al. | 437/194 |
| 5,358,901 | 10/1994 | Fiordalice et al. | 257/765 |
| 5,371,410 | 12/1994 | Chen et al. | 257/750 |
| 5,374,592 | 12/1994 | MacNaughton et al. | 437/194 |
| 5,391,517 | 2/1995 | Gelatos et al. | 437/190 |
| 5,488,014 | 1/1996 | Harada et al. | 437/192 |
| 5,523,259 | 6/1996 | Merchant et al. | 437/190 |
| 5,543,357 | 8/1996 | Yamada et al. | 437/192 |
| 5,594,278 | 1/1997 | Uchiyama | 257/751 |
| 5,604,155 | 2/1997 | Wang | 437/190 |

*Primary Examiner*—Tom Thomas
*Assistant Examiner*—David B. Hardy
*Attorney, Agent, or Firm*—Ronald P. Kananen

[57] ABSTRACT

A multilayer interconnect structure for a semiconductor device. The structure comprises a lower patterned metallization layer, a higher patterned metallization layer, and filled holes for electrically interconnecting these two layers. The two metallization layers are formed out of aluminum or an aluminum alloy by high-temperature aluminum sputtering or aluminum reflow techniques. A suction-preventing layer is formed either at the bottoms of the contact holes or on the surface of the lower metallization layer to prevent the material of the lower metallization layer from being sucked into the overlying contact holes.

7 Claims, 11 Drawing Sheets

EXAMPLE 1

EXAMPLE 2

EXAMPLE 4

EXAMPLE 6

EXAMPLE 6

VOID

MULTILAYER INTERCONNECT STRUCTURE FOR SEMICONDUCTOR DEVICE AND METHOD OF MANUFACTURING SAME

This application is a continuation of application Ser. No. 08/557,681 filed Nov. 13, 1995, now abandoned which is a continuation of prior application Ser. No. 08/262,024 filed on Jun. 17, 1994, now abandoned.

FIELD OF THE INVENTION

The present invention relates to a multilayer interconnect structure for a semiconductor device and also to a method of manufacturing such a multilayer interconnect structure. More particularly, the invention relates to a multilayer interconnect structure formed by sputtering aluminum and also to a method of manufacturing such a multilayer interconnect structure.

BACKGROUND OF THE INVENTION

A semiconductor device is provided with a multiplicity of through holes or via holes for interconnection (hereinafter referred to as "contact hole"). The holes are filled with a conductive material. Usually, the contact hole for interconnection are obtained by forming an insulating base layer on a semiconductor substrate, forming a lower metallization layer on the insulating base layer, forming holes in the insulating layer, and then filling the holes with a metallization material. As semiconductor devices are packed on a chip at an increasing density, design rules adopted in semiconductor fabrication processes have been reduced. With this trend, a technique for burying a metallization material in openings having a high aspect ratio have become more important.

It is common practice to utilize a sputtering method using pure aluminum or an aluminum alloy (hereinafter often referred to as an aluminum material), in order to bury a metallization material in openings. Where this sputtering method is adopted, as the aspect ratio of the openings is increased, sputtering particles consisting of an aluminum material are less easily deposited on the bottoms of the openings or on side walls close to the bottoms because of shadowing effects. That is, the sputtering particles are not readily deposited on optically shadow portions formed on the side and bottom portions of the openings. As a result, the step coverage of the aluminum material on the bottom and nearby side walls of the openings deteriorates. In these portions, conductive interconnects break easily.

As a means for solving these problems, a so-called high-temperature aluminum sputtering method and an aluminum reflow method have been discussed. Where these techniques are employed, contact holes and an overlying metallization layer can be formed at the same time. This simplifies the semiconductor fabrication process. Hence, they are regarded as promising techniques.

In the high-temperature aluminum sputtering method, a base layer such as a semiconductor substrate is heated to a high temperature between 400° C. and the melting point of the aluminum material when the alloy is sputtered. The aluminum material deposited on the insulating layer is made to flow and enter into the openings, thus filling the opening with the aluminum material. In this way, contact holes are completed. At the same time, the Al alloy on the insulating layer is flattened to form an upper metallization layer. A high-temperature bias sputtering method in which a high-temperature sputtering process is carried out while applying a bias voltage to the base layer is also embraced in the high-temperature aluminum sputtering method referred to herein. These are also collectively referred to simply as the high-temperature aluminum sputtering method.

In the aluminum reflow method, an aluminum material is deposited on an insulating layer including openings by sputtering while heating the base layer to about 150° C. Then, the base layer is heated to a high temperature between 400° C. and the melting point of the aluminum material to cause the aluminum material deposited on the insulating layer to flow and enter into the openings. In this way, the openings are filled with the aluminum material, and contact holes are completed. Concurrently, the aluminum material on the insulating film is flattened. Thus, an upper metallization layer is completed.

In these techniques, if a bottom layer is formed out of a material such as titanium (Ti) which shows good wettability with the aluminum material, and if the aluminum material is fluidized, then the interface reaction between the aluminum material and the bottom layer of Ti progresses well. It is known that the aluminum material is thus alloyed with the titanium of the bottom layer. As a result, the Al material is buried in the openings with improved characteristics.

The manner in which a multilayer interconnect structure and contact holes are formed by the prior art high-temperature aluminum sputtering process is described briefly below by referring to FIGS. 10A to 10C, which are schematic fragmentary cross sections of a semiconductor device.

Step 10

A base layer 10 consists of an insulating bottom layer formed on a semiconductor substrate (not shown). First, a lower metallization layer 12 is formed on the base layer 10 out of an Al alloy by ordinary sputtering and patterning techniques. Then, an insulating layer 20 made of $SiO_2$ and having a thickness of 500 nm is formed on the lower metallization layer 12 by CVD. Thereafter, openings 22 (only one is shown) are formed in the insulating layer 20 overlying the lower metallization layer 12, for example by RIE (reactive ion etch)(FIG. 10A).

Step 20

Subsequently, in order to improve the wettability of an aluminum or aluminum alloy layer formed in the next step, a support layer 24 is formed over the whole surface of the insulating layer 20 including the openings 22 by sputtering techniques. For example, the support layer 24 consists of a Ti film having a thickness of 100 nm (FIG. 10B).

Step 30

Then, the base layer 10 is heated to, for example 500° C. Under this condition, an aluminum alloy layer 26 consisting of aluminum containing 1% silicon is deposited over the whole surface of the insulating layer 20 including the openings 22. The Al alloy layer 26 deposited on the insulating layer 20 is made to flow and enter into the openings 22. This assures that the openings 22 are filled up with the Al alloy. At this time, titanium of the support layer 24 reacts with the aluminum of the Al alloy, so that an alloy layer of $TiAl_3$ (not shown) is formed between the support layer 24 and the Al alloy layer 26. In this way, the support layer 24, the alloy layer of $TiAl_3$, and the Al alloy layer 26 are laminated to thereby form an upper metallization layer 30 on the insulating layer 20 (FIG. 10C). Also, the support layer 24, the alloy layer, and the Al alloy layer 26 are buried in the openings 22 and thus contact holes 32 (only one is shown) are formed. Then, the upper metallization layer 30 and the support layer 24 are photolithographically patterned to complete desired upper conductive interconnects.

Before the execution of the high-temperature aluminum sputtering process, the base layer is usually preliminarily heated, i.e., heated to 300°–600° C. for about 0.5 to 2 minutes; otherwise gases mainly consisting of $H_2O$ and given off from the insulating layer 20 would oxidize the sputtered aluminum material, thus creating poor electrical conduction. Also, in the aluminum reflow method, similar preliminary heating is done before an Al alloy film is formed by sputtering.

Where such preliminary heating is done, the lower metallization layer 12 at the bottoms of the openings 22 rises, as shown in FIG. 11A. Under this condition, if the support layer 24 is formed by sputtering, then the step coverage for the support layer 24 near the bottoms of the openings deteriorates. This makes it impossible to make the support layer 24 sufficiently thick.

Where a multilayer interconnect structure or multilevel metallization structure is formed by a high-temperature aluminum sputtering method, the bottom layer is heated to a high temperature. As a result, the Al alloy atoms constituting the lower metallization layer 12 are diffused into the support layer 24 and penetrate through this layer 24. The Al alloy atoms are sucked into the overlying contact holes 32, as shown in FIG. 11B. In consequence, voids are created in the lower metallization layer 12. This renders the electrical conduction of the lower metallization layer 12 poor. Also, the electrical conduction between the lower metallization layer 12 and the upper metallization layer 30 is made poor.

Also, where a multilayer interconnect structure is formed by an aluminum reflow process, the base layer is heated to a high temperature. This presents problems similar to the problems caused by a high-temperature aluminum sputtering method.

SUMMARY OF THE INVENTION

Accordingly, it is a first object of the present invention to provide a multilayer interconnect structure for a semiconductor device, the multilayer interconnect structure comprising a lower metallization layer and an upper metallization layer formed out of aluminum or an aluminum alloy by a high-temperature aluminum sputtering method or by an aluminum reflow method, together with contact holes for electrically interconnecting the two metallization layers, the interconnect structure being characterized in that the lower metallization layer is prevented from rising or that the material of the lower metallization layer is prevented from being sucked into the overlying contact holes.

It is a second object of the invention to provide a method of manufacturing a multilayer interconnect structure for a semiconductor device by forming a lower metallization layer out of aluminum or an aluminum alloy by a high-temperature aluminum sputtering method, forming an upper metallization layer out of aluminum or an aluminum alloy by a high-temperature aluminum sputtering method or an aluminum reflow method, and forming contact holes for electrically interconnecting the lower and upper metallization layers, the method being characterized in that the lower metallization layer is prevented from rising or that the material of the lower metallization layer is prevented from being sucked into the overlying contact holes.

In a first embodiment of the invention, the above-described first object is achieved by a semiconductor device having a multilayer interconnect structure and comprises: a first patterned metallization layer made of an aluminum or aluminum alloy material and formed on a base layer; a insulating layer formed on the first metallization layer and provided with at least one contact hole for exposing parts of the first metallization layer, the hole being filled with the aluminum or aluminum alloy material to thereby form at least one contact hole; a second patterned metallization layer formed on the first insulating layer and made of an aluminum or aluminum alloy material, the second metallization layer being connected with the first metallization layer via the contact hole; and a suction-preventing layer formed at least at a bottom of the contact hole to prevent the aluminum or aluminum alloy material of the first metallization layer from being sucked into the contact hole.

Preferably, the suction-preventing layer is made of at least one material selected from the group consisting of TiN, TiON, TiW, W, and WN.

Preferably, the suction-preventing layer is made of Ti or W and has a nitrided or oxidized surface.

Preferably, a metal layer is formed on a surface of the insulating layer to improve electrical conduction between the suction-preventing layer and the first metallization layer.

Further, preferably, a metal layer is formed on a surface of the suction-preventing layer to improve wettability with the aluminum or aluminum alloy material of the metallization layers.

In a second embodiment of the invention, the above-described second object is achieved by a method of manufacturing a semiconductor device, comprising the steps of: forming a first metallization layer out of an aluminum or aluminum alloy material on a base layer; forming an insulating layer on the first metallization layer; forming at least one contact hole in the insulating layer to expose selected portions of the first metallization layer; forming a suction-preventing layer at least at a bottom of the hole to prevent the aluminum or aluminum alloy material of the first metallization layer from being sucked into the contact hole; and forming a second metallization layer of aluminum or an aluminum alloy such that the contact hole is filled with the aluminum or aluminum alloy material, whereby the second metallization layer is connected with the first metallization layer via the contact hole.

Preferably, the suction-preventing layer is formed by a sputtering method out of at least one material selected from the group consisting of TiN, TiON, TiW, W, and WN.

Preferably, the suction-preventing layer is formed by sputtering Ti or W to form a metal layer and nitriding or oxidizing a surface of the metal layer.

The sputtering method may be a collimation sputtering technique.

Preferably, the suction-preventing layer is formed out of TiN, W, or WN by CVD.

The suction-preventing layer may be formed by forming a W layer by CVD and then nitriding a surface of the W layer.

The suction-preventing layer may be annealed after the suction-preventing layer is formed.

A third embodiment of the invention lies in a semiconductor device which has a multilayer interconnect structure and which comprises: a first patterned metallization layer made of an aluminum or aluminum alloy material and formed on a base layer; an metallization layer formed on the first metallization layer and provided with at least one hole for exposing parts of the first insulating layer, the hole being filled with the aluminum or aluminum alloy material to thereby form at least one contact hole; a second patterned metallization layer formed on the insulating layer and made of an aluminum or aluminum alloy material, the second metallization layer being connected with the first metallization layer via the contact hole; and a suction-preventing layer formed on a surface of the first metallization layer to prevent the aluminum or aluminum alloy material of the first metallization layer from being sucked into the contact hole.

In the third embodiment, the suction-preventing layer may be formed by a sputtering method out of at least one material selected from the group consisting of TiN, TiON, TiW, W, and WN.

In the third embodiment, a Ti layer may be formed between the suction-preventing layer and the first metallization layer.

A fourth embodiment of the invention lies in a method of manufacturing a semiconductor device having a multilayer interconnect structure, comprising the steps of: forming a first patterned metallization layer out of an aluminum or aluminum alloy material on a base layer; forming a suction-preventing layer on a surface of the first metallization layer to prevent the aluminum or aluminum alloy material of the first metallization layer from being sucked into at least one contact hole; forming an insulating layer on the suction-preventing layer; forming at least one contact hole in the insulating layer to expose selected portions of the first metallization layer; and forming a second patterned metallization layer out of an aluminum or aluminum alloy material such that the hole is charged with the aluminum or aluminum alloy material, whereby the second metallization layer is connected with the first metallization layer via the contact hole.

In one aspect of the fourth embodiment, the suction-preventing layer is formed by a sputtering method out of at least one material selected from the group consisting of TiN, TiON, TiW, W, and WN.

In another aspect of the fourth embodiment, a Ti layer is formed on a surface of the first metallization layer by a sputtering method before formation of the suction-preventing layer.

In a further aspect of the fourth embodiment, the suction-preventing layer is annealed after the suction-preventing layer is formed.

In a still other aspect of the fourth embodiment, formation and annealing the suction-preventing layer are carried out in succession in a vacuum.

In the present invention, a suction-preventing layer is formed at the bottom of each contact hole or on the surface of a lower metallization layer to prevent the aluminum or aluminum alloy material of the lower metallization layer from being sucked into the contact holes. Therefore, during preliminary heating or during high-temperature aluminum sputtering or aluminum reflow process, the lower metallization layer is prevented from rising, or the material of the lower metallization layer is prevented from being sucked into the contact holes.

Some embodiments of the invention are described below by referring to the drawings. In Examples 1-5, a suction-preventing layer is formed at the bottom of each contact hole according to the first embodiment of the invention, which embraces multilayer interconnect structures for a semiconductor device and methods of manufacturing such multilayer interconnect structures. In Example 6, a suction-preventing layer is formed on the surface of a lower metallization layer according to the second embodiment of the invention, which embraces multilayer interconnect structures for a semiconductor device and methods of manufacturing such multilayer interconnect structures where a suction-preventing layer is formed on the surface of a lower metallization layer.

DETAILED DESCRIPTION OF THE INVENTION

EXAMPLE 1

Figure 1:
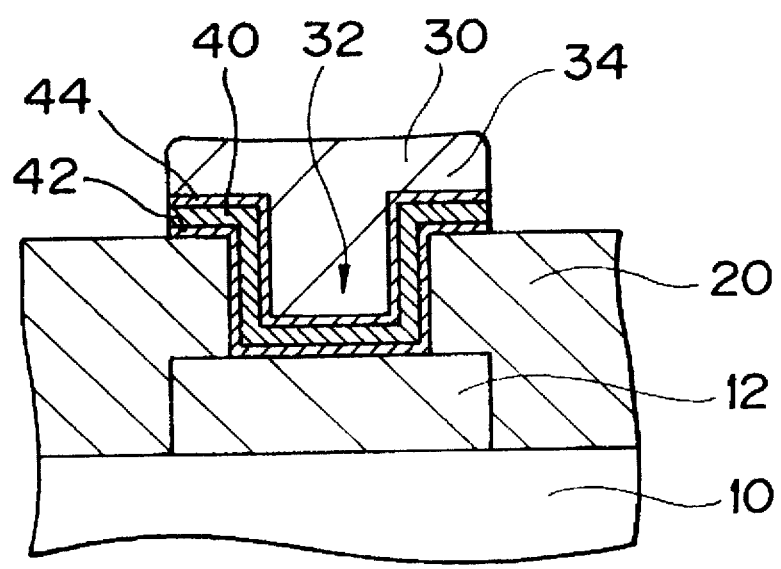
FIG. 1 is a schematic fragmentary cross section of a semiconductor device having a multilayer interconnect structure forming Example 1 of the invention.

Examples 1-5 relate to multilayer interconnect structures and methods of fabricating them according to the first embodiment of the invention. A multilayer interconnect structure of Example 1 is shown in the schematic fragmentary cross section of FIG. 1. This multilayer interconnect structure comprises a patterned lower metallization layer 12 made of aluminum or an aluminum alloy and formed on a base layer 10, an insulating layer 20 coated on the lower metallization layer 12, a patterned upper metallization layer 30 made of aluminum or an aluminum alloy and formed on the insulating layer 20, and contact holes 32 (only one is shown) for electrically interconnecting the lower metallization layer 12 and the upper metallization layer 30. The contact holes 32 are made of aluminum or an aluminum alloy and formed in the insulating layer 20. A suction-preventing layer 40 is formed at least at the bottoms of the contact holes 32 to prevent the aluminum or aluminum alloy material of the lower metallization layer 12 from being sucked into the overlying contact holes 32.

The base layer 10 consists of an insulating bottom layer. In Example 1, the suction-preventing layer 40 is made of TiN and fabricated by sputtering. The upper metallization layer 30 and the contact holes 32 are fabricated by high-temperature aluminum sputtering techniques. A first Ti layer 42 is formed between the suction-preventing layer 40 and the insulating layer 20 or between the suction-preventing layer 40 and the lower metallization layer 12. A second Ti layer 44 is formed between the suction-preventing layer 40 and the upper metallization layer 30 or between the suction-preventing layer 40 and the aluminum or aluminum alloy material filling the holes 32. A method of fabricating the multilayer interconnect structure of Example 1 is described next by referring to the schematic fragmentary cross sections of FIGS. 2A to 2C.

Step-100

Figure 2A:
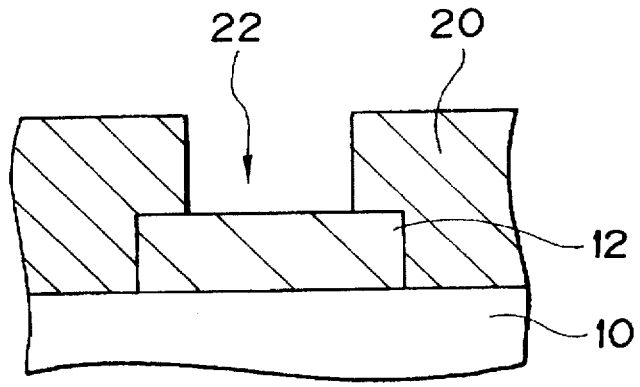
FIGS. 2A to 2C are schematic fragmentary cross sections of the semiconductor device shown in FIG. 1, illustrating the process sequence of Example 1.

A base layer 10 consisting of an insulating bottom layer made of, for example $SiO_2$, is formed on a semiconductor substrate (not shown). A lower metallization layer 12 is formed on the base layer 10 by conventional sputtering and patterning techniques. This lower metallization layer 12 is made of aluminum or an aluminum alloy, e.g., aluminum containing 1% silicon. Then, an insulating layer 20 consisting of $SiO_2$ and having a thickness of 0.5 μm is formed on the lower metallization layer 12 by conventional CVD techniques. Thereafter, openings 22 (only one is shown) are formed in the insulating layer 20 over the lower metallization layer 12 by dry etching (FIG. 2A). The diameter of each opening is 0.7 μm For example, the dry etching process is carried out under the following conditions:

used gases: $CF_4/CHF_3/Ar=70/30/450$ sccm

RF power: 600 W pressure: 300 Pa

Step-110

Then, a suction-preventing layer 40 is formed at least at the bottoms of the openings 22 by sputtering. This layer 40 serves to prevent the aluminum or aluminum alloy material of the lower metallization layer 12 from being sucked into contact holes formed later. For this purpose, it is desired to form a first Ti layer 42 having a thickness of 30 nm over the whole surface of the insulating layer 20 including the openings 22 by sputtering, making use of a single wafer processing magnetron sputtering machine. This first Ti layer 42 acts to improve the electrical conduction between the suction-preventing layer 40 and the lower metallization layer 12. For example, the first Ti layer 42 is formed under the following conditions:

process gas: Ar=100 sccm

DC power: 4 kW pressure: 0.4 Pa base layer temperature: 150° C.

Subsequently, the suction-preventing layer 40 consisting of TiN and having a thickness of 70 nm is formed on the first Ti layer 42 by sputtering. For instance, the suction-preventing layer 40 is formed under the following conditions:

process gases: $Ar/N_2=30/70$ sccm

DC power: 5 kW pressure: 0.4 Pa base layer temperature: 150° C.

The thickness of the suction-preventing layer 40 consisting of TiN is approximately 30 to 150 nm.

Figure 2B:
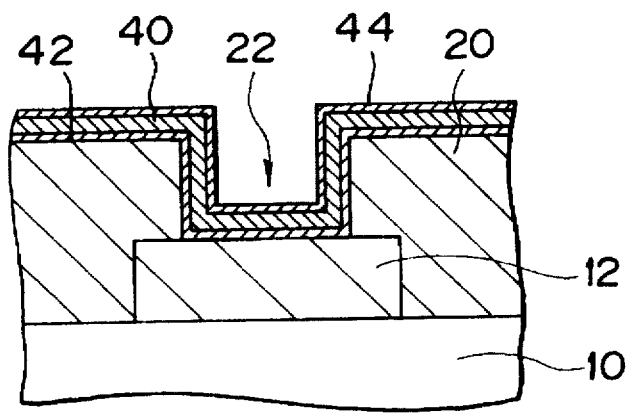

Preferably, a second Ti layer 44 having a thickness of 100 nm is formed on the suction-preventing layer 40 in order to improve the wettability of a metallization material consisting of aluminum or an aluminum alloy deposited next (FIG. 2B). The second Ti layer 44 can be fabricated under the same conditions as the first Ti layer 42.

Step-120

Figure 2C:
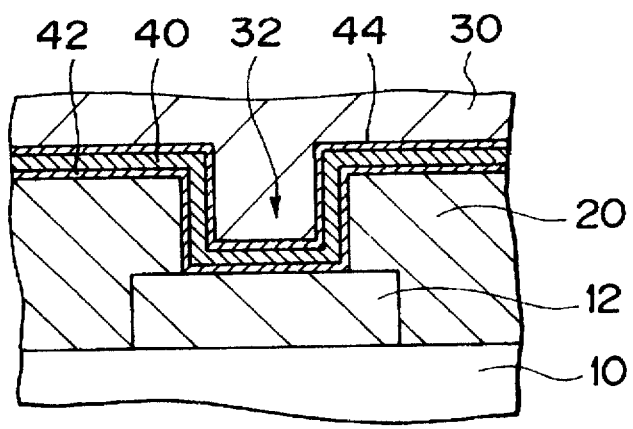

Subsequently, the Semiconductor substrate on which the various layers described have been formed is transported into a separate chamber under a vacuum to prevent the second Ti layer 44 from oxidizing. The laminate is heated to 200° C. for 1 minute preliminarily to drive off gases consisting mainly of $H_2O$ from the insulating layer 20. Then, a metallization material consisting of aluminum or an aluminum alloy, e.g., aluminum containing 1% silicon, is deposited on the second Ti layer 44 by high-temperature aluminum sputtering techniques (FIG. 2C). The thickness of the metallization material layer on the insulating layer 20 is 600 nm. In this high-temperature aluminum sputtering process, the temperature of the base layer 10 is controlled within a range from 400° C. to the melting point of the metallization material. The metallization material deposited on the insulating layer 20 is fluidized and flows into the openings 22. This assures that the openings 22 are filled with the metallization material. For example, the high-temperature aluminum sputtering process is carried out under the following conditions:

process gas: Ar=100 sccm

DC power: 10 kW sputtering pressure: 0.4 Pa base layer temperature: 500° C.

film deposition rate: 600 nm/min

In this way, an upper metallization layer 30 consisting of aluminum or an aluminum alloy is formed on the insulating layer 20. At the same time, the metallization material is buried in the openings 22. In consequence, contact holes 32 for electrically interconnecting the lower metallization layer 12 and the upper metallization layer 30 are formed.

Step-130

Then, the upper metallization layer 30, the second Ti layer 44, the suction-preventing layer 40, and the first Ti layer 42 on the insulating layer 20 are selectively removed. Thus, upper interconnects 34 are completed (FIG. 1).

The presence of the suction-preventing layer 40 consisting of TiN prevents the lower metallization layer 12 at the bottoms of the openings 22 from rising even if the base layer 10 is heated. Also, even if the base layer 10 is heated to a high temperature during the high-temperature aluminum sputtering process, the material of the lower metallization layer 12 is prevented from being sucked into the overlying contact holes 32.

EXAMPLE 2

Example 2 is a modification of Example 1. In Example 1, high-temperature aluminum sputtering techniques are used to form the upper metallization layer 30 and the contact holes 32. On the other hand, in Example 2, the upper metallization layer 30 and the contact holes 32 are formed by an aluminum reflow method. A method of fabricating a multilayer interconnect structure of Example 2 is described next by referring to FIGS. 3A and 3B.

Step-200

In the same way as in step-100 of Example 1, a lower metallization layer 12 consisting of aluminum or an aluminum alloy is formed on a base layer 10, an insulating layer 20 is formed on the lower metallization layer 12, and then openings 22 are formed in the insulating layer 20 overlying the lower metallization layer 12. These steps are not described in detail below.

Step-210

In the same way as in step-110 of Example 1, a first Ti layer 42, a suction-preventing layer 40, and a second Ti layer 44 are formed. These steps are not described in detail below.

Step-220

Figure 3A:
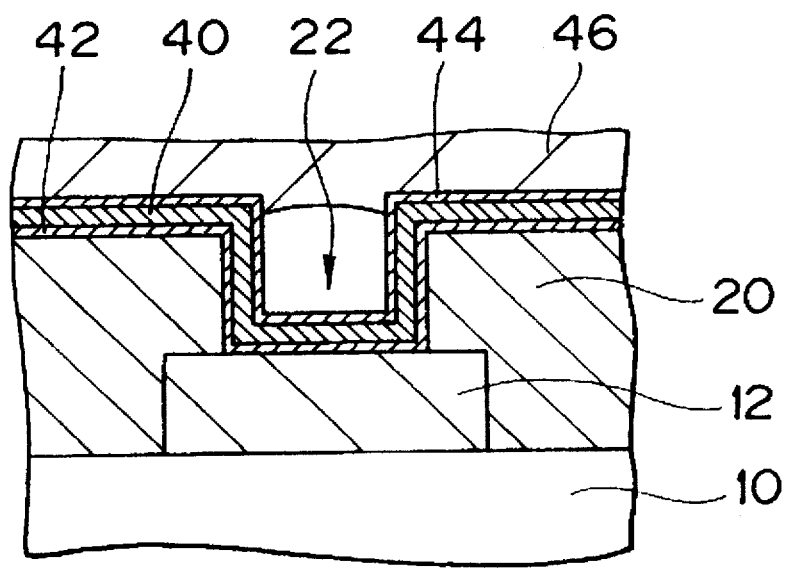
FIGS. 3A and 3B are schematic fragmentary cross sections of a semiconductor device having a multilayer interconnect structure, illustrating some successive manufacturing steps of Example 2.
Figure 3B:
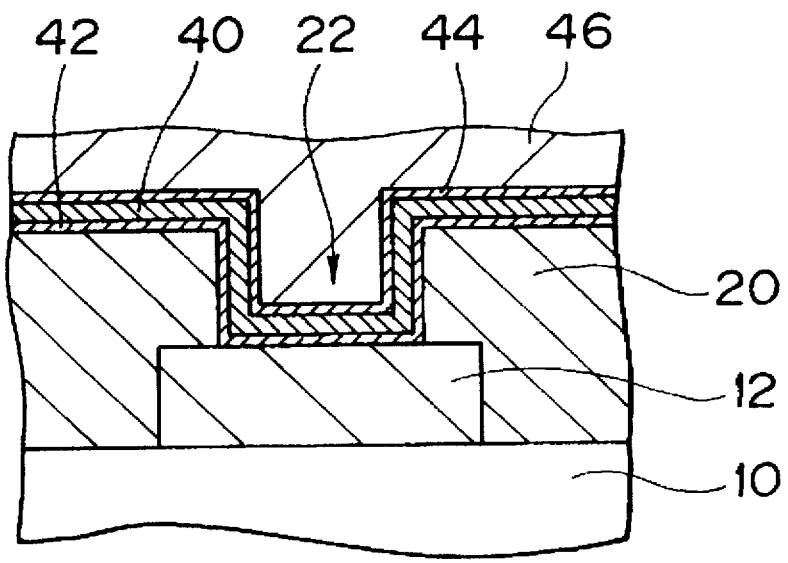

Subsequently, the semiconductor substrate on which the various layers described have been formed is transported into a separate chamber under a vacuum to prevent the second Ti layer 44 from oxidizing. The laminate is heated to 200° C. for 1 minute preliminarily to give off gases consisting mainly of $H_2O$ from the insulating layer 20. Then, a metallization material 46 consisting of aluminum or an aluminum alloy, e.g., aluminum containing 1% silicon, is deposited on the second Ti layer 44 by conventional aluminum sputtering techniques (FIG. 3A). The thickness of the metallization material layer 46 on the insulating layer 20 is 600 nm. For example, the aluminum sputtering process is carried out under the following conditions:

process gas: Ar=100 sccm
   DC power: 20 kW
   sputtering pressure: 0.4 Pa
   base layer temperature: 150° C.
   film deposition rate: 1200 nm/min Then, the base layer 10 is heated to a high temperature between 400° C. and the melting point of the aluminum material to cause the metallization material layer 46 deposited on the insulating layer 20 to flow and enter into the openings 22. In this way, the openings 22 are filled with the metallization material with certainty (FIG. 3B). For example, the heating operation is effected under the following conditions:

heating method: heating of rear surface of the substrate, using a gas
   heating temperature: 500° C.
   heating time: 2 minutes
   process gas: Ar=100 sccm
   process gas pressure: $1.1 \cdot 10^3$ Pa In particular, a heater block installed on the rear surface of the substrate is heated to a desired temperature, or the heating temperature. The process gas is introduced between the heater block and the rear surface of the substrate to thereby heat the substrate. For this heating, a lamp or lamps may also be employed.

In this way, the upper metallization layer 30 made of aluminum or an aluminum alloy is formed on the insulating layer 20, as shown in FIG. 2C. At the same time, the openings 22 are charged with the metallization material. Contact holes 32 which electrically interconnect the lower metallization layer 12 and the upper metallization layer 30 are formed.

Step-230

Then, as shown in FIG. 1, the upper metallization layer 30, the second Ti layer 44, the suction-preventing layer 40, and the first Ti layer 42 on the insulating layer 20 are selectively removed. Thus, upper interconnects 34 are completed.

The presence of the suction-preventing layer 40 consisting of TiN prevents the lower metallization layer 12 at the bottoms of the openings 22 from protruberating even if the base layer 10 is heated preliminarily. Also, even if the base layer 10 is heated to a high temperature to fluidize the aluminum or aluminum alloy material, the material of the lower metallization layer 12 is prevented from being sucked into the overlying contact holes 32.

EXAMPLE 3

In Examples 1 and 2, the suction-preventing layer 40 consisting of TiN is used. In Example 3, a suction-preventing layer 40 consisting of TiON is formed by sputtering. The manufacturing steps of Example 3 are similar to the steps of Examples 1 and 2 except for the manner in which the suction-preventing layer 40 is formed. That is, in Example 1, the layer 40 is formed in step 110. In Example 2, the layer 40 is formed in step-210. Therefore, the steps of Example 3 are not described in detail below.

For example, in Example 3, the suction-preventing layer 40 consisting of TiON is formed under the following conditions:

process gases: $Ar/N_2$-6% $O_2$=30/70 sccm
   DC power: 5 kW
   pressure: 0.4 Pa
   base layer temperature: 150° C.

The thickness of the suction-preventing layer 40 consisting of TiON is about 30 to 150 nm.

The suction-preventing layer 40 may be made of tungsten (W). For example, the suction-preventing layer 40 of W can be formed under the following conditions:

process gas: Ar=80 sccm
   DC power: 3 kW
   pressure: 0.4 Pa
   base layer temperature: 150° C.

The thickness of the suction-preventing layer 40 consisting of W is about 30 to 150 nm.

The suction-preventing layer 40 consisting of WN or TiN may be formed by ordinary sputtering techniques. In Examples 1–3, the first Ti layer 42 or the second Ti layer 44 may be omitted if circumstances allow.

EXAMPLE 4

In Example 4, the step of forming a suction-preventing layer 40 consists of forming a Ti layer by sputtering and nitriding the surface of the Ti layer. Example 4 is hereinafter described in detail by referring to FIGS. 4A and 4B, which are schematic fragmentary cross sections of a semiconductor device.

Step-400

A lower metallization layer 12 is formed on a base layer 10 out of aluminum or an aluminum alloy, an insulating layer 20 is formed on the lower metallization layer 12, and then openings 22 are formed in the insulating layer 20 overlying the lower metallization layer 12, in the same way as in step-100 of Example 1, and so these steps are not described in detail below.

Step-410

Figure 4A:
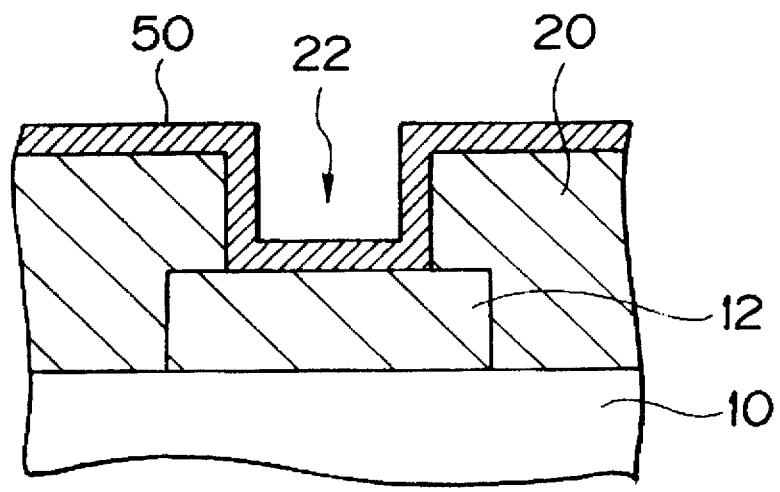
FIGS. 4A and 4B are schematic fragmentary cross sections of a semiconductor device having a multilayer interconnect structure, illustrating some successive manufacturing steps of Example 4.

Then, a suction-preventing layer 40 is formed over the whole surface of the insulating layer 20 including the openings 22. For this purpose, a Ti layer 50 having a thickness of 100 nm is first formed over the whole surface of the insulating layer 20 including the openings 22 (FIG. 4A). For example, the Ti layer 50 can be formed under the following conditions:

process gas: Ar=100 sccm
   DC power: 4 kW
   pressure: 0.4 Pa
   base layer temperature: 150° C.

The thickness of the Ti layer 50 is about 30 to 200 nm.

Figure 4B:
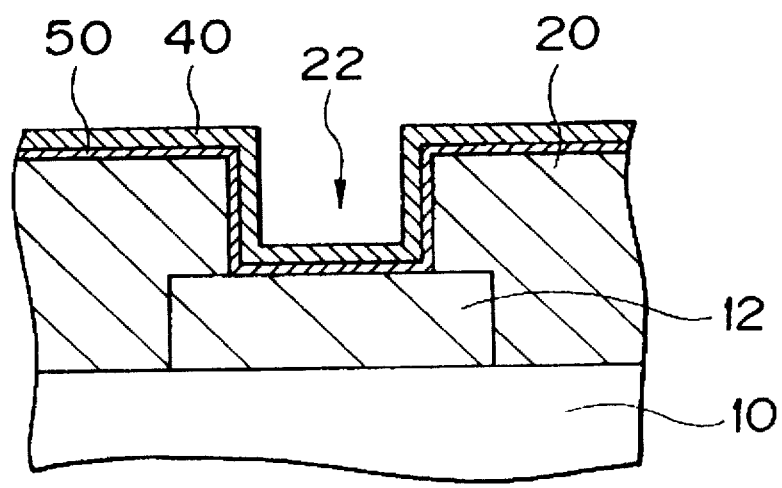

Thereafter, the surface of the Ti layer 50 is nitrided, using $N_2$ plasma, and a suction-preventing layer 40 consisting of TiN is formed on the surface of the Ti layer 50 (FIG. 4B). For instance, this nitriding step can be carried out under the following conditions:

used gas: $N_2$ 100%
   RF power: 200 W
   pressure: 5 Pa
   nitriding temperature: 100° C.

Preferably, the thickness of the suction-preventing TiN layer 40 formed on the Ti layer 50 is 50 to 80% of the thickness of the Ti layer 50 formed initially. NH$_3$ gas may also be used for the nitriding.

Then, if necessary, a second Ti layer 44 is formed on the suction-preventing layer 40, in the same way as in step-110 of Example 1.
Step-420

Subsequently, an upper metallization layer 30 and contact holes 32 are formed by a high-temperature aluminum sputtering method, in the same manner as in step-120 of Example 1. Alternatively, the upper metallization layer 30 and the contact holes 32 are formed by an aluminum reflow method, in the same manner as in step-220 of Example 2.
Step-430

Then, the upper metallization layer 30, the second Ti layer 44, and the suction-preventing layer 40 on the insulating layer 20 are selectively removed. Thus, upper interconnects 34 are completed.

Since the nitrided suction-preventing layer 40 of TiN exists on the surface of the Ti layer 50, even if the base layer 10 is preliminarily heated, the lower metallization layer 12 at the bottoms of the openings 22 is prevented from rising. Also, since the metallization material that is aluminum or an aluminum alloy is fluidized, even if the base layer 10 is heated to a high temperature, the material of the lower metallization layer 12 is prevented from being sucked into the overlying contact holes 32.

Instead of forming the suction-preventing layer 40 by forming the Ti layer 50 and nitriding the surface of the Ti layer 50, the layer 40 can be formed by forming the Ti layer 50 and oxidizing the surface of the Ti layer 50. In this case, the surface of the Ti layer 50 can be oxidized under the following conditions:

used gases: N$_2$-10% O$_2$
RF power: 200 W
pressure: 5 Pa
oxidizing temperature: 100° C.

Preferably, the thickness of the suction-preventing oxide layer 40 formed on the surface of the Ti layer 50 is 50 to 80% of the thickness of the Ti layer 50 formed initially.

Also, instead of forming the suction-preventing layer 40 by forming the Ti layer 50 and nitriding the surface of the Ti layer 50, the layer 40 can be formed by forming a W layer and oxidizing the surface of the W layer. In this case, the W layer may be formed under the same conditions as in Example 3. For example, the nitriding of the W layer surface, using N$_2$ plasma, can be effected under the following conditions:

used gas: N$_2$ 100%
RF power: 200 W
pressure: 5 Pa
nitriding temperature: 100° C.

Preferably, the thickness of the suction-preventing WN layer 40 formed on the surface of the W layer is 50 to 80% of the thickness of the W layer formed initially.

Furthermore, the suction-preventing layer may be formed by forming a W layer and oxidizing the surface of the W layer. In this case, the W layer may be formed under the same conditions as in Example 3. For example, the W layer surface can be oxidized under the following conditions:

used gases: N$_2$-10% O$_2$
RF power: 200 W
pressure: 5 Pa
oxidizing temperature: 100° C.

Figure 5A:
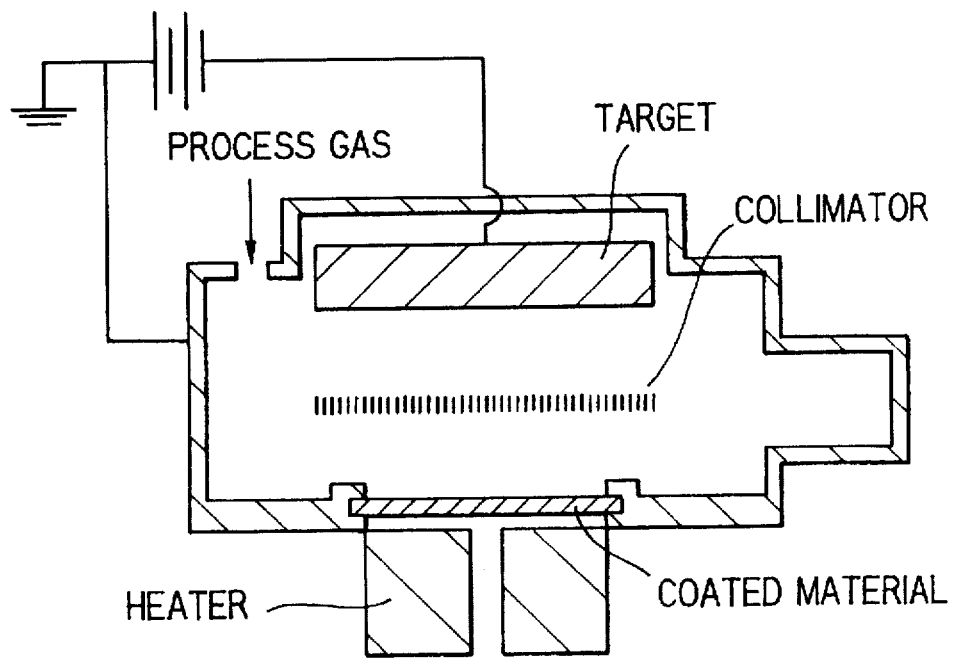
FIG. 5A is a schematic view of a collimator sputtering machine used to form a suction-preventing layer according to the invention.
Figure 5B:
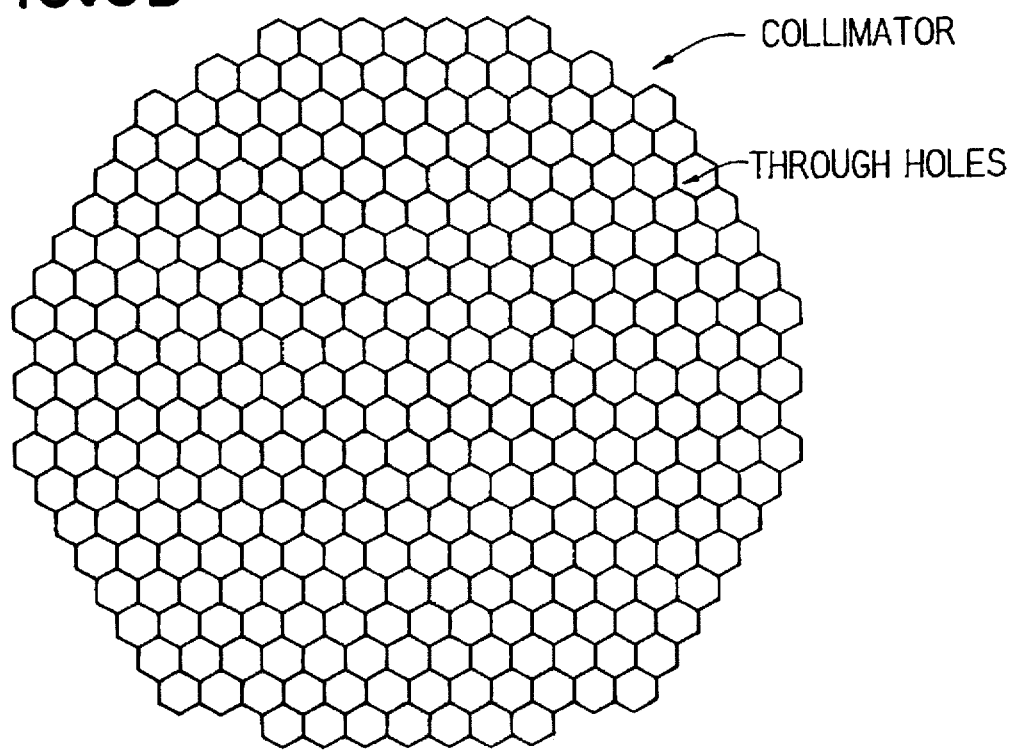
FIG. 5B is a schematic plan view of the collimator shown in FIG. 5A.

Preferably, the thickness of the suction-preventing oxide layer 40 formed on the surface of the W layer is 50 to 80% of the thickness of the W layer formed initially.

Where the above-described suction-preventing layer 40 is formed by sputtering, so-called collimator sputtering can be utilized. The collimator sputtering means a technique for carrying out sputtering while placing a collimator between the target of a sputtering machine and a coated material (in the present invention, a base layer), as schematically shown in FIG. 5A. The collimator is schematically shown in FIG. 5B and comprises a lattice-like jig provided with a number of through holes extending in the direction of the thickness, the jig having a large numerical aperture. The jig passes various particle beams for forming a thin film with uniaxial anisotropy and causes the beams to reach the surface of the coated material. By appropriately setting the ratio of the length of the axial dimension of each through hole to the diameter of the opening, the angle of incidence of the particle beams passed through the collimator to the coated material can be controlled. The cross-sectional shape of each through hole is a circle, a hexagon, or other polygon. The material is a metal, a ceramic, or a plastic and is selected, depending on the purpose. The angle of incidence of the sputtering particles to the coated material can be set to a small angle, e.g., 0 to 30 degrees, so that no optical shadow may be formed inside the openings, by the use of the collimator. In this way, the thickness of the suction-preventing layer 40 at the bottom of the opening can be increased. The cross-sectional shape of the holes extending through the collimator shown in FIG. 5B is a regular hexagon.

The collimator sputtering step can be carried out in the same way as in Examples 1–4 and is not described in detail. Aluminum or an aluminum alloy can be deposited as a metallization layer by collimator sputtering. Also, the first and second Ti films can be formed by collimator sputtering.

EXAMPLE 5

In Example 5, the suction-preventing layer 40 is made of TiN and fabricated by CVD.
Step-500

A lower metallization layer 12 is formed on a base layer 10 out of aluminum or an aluminum alloy, an insulating layer 20 is formed on the lower metallization layer 12, and then openings 22 are formed in the insulating layer 20 overlying the lower metallization layer 12, in the same way as in step-100 of Example 1, and so these steps are not described in detail below.
Step-510

Then, the suction-preventing layer 40 is formed over the whole surface of the insulating layer 20 including the openings 22. For this purpose, a first Ti layer 42 having a thickness of 30 nm is preferably formed over the whole surface of the insulating layer 20 by ECR CVD. For example, the first Ti layer 42 can be formed under the following conditions:

used gases: T$_i$Cl$_4$/H$_2$=10/50 sccm
microwave energy: 2.8 kW
pressure: 0.12 Pa
base layer temperature: 420° C.

Subsequently, a suction-preventing layer 40 having a thickness of 70 nm is formed out of TiN on the first Ti layer 42 by ECR CVD. For example, the suction-preventing layer 40 can be formed under the following conditions:

used gases: T$_i$Cl$_4$/H$_2$/N$_2$=20/26/8 sccm
microwave energy: 2.8 kW
pressure: 0.23 Pa
base layer temperature: 420° C.

The thickness of the suction-preventing layer 40 is approximately 10 to 70 nm.

Preferably, a second Ti layer 44 having a thickness of 100 nm is formed on the suction-preventing layer 40 by ECR CVD to improve the wettability of the subsequently deposited metallization material, or aluminum or an aluminum alloy. The second Ti layer 44 can be formed under the same conditions as the first Ti layer 42. The first Ti layer 42 and the second Ti layer 44 may be formed by sputtering.

Step-520

Subsequently, an upper metallization layer 30 and contact holes 32 are formed by a high-temperature aluminum sputtering method, in the same manner as in step-120 of Example 1. Alternatively, the upper metallization layer 30 and the contact holes 32 are formed by an aluminum reflow method, in the same manner as in step-220 of Example 2.

Step-530

Then, the upper metallization layer 30, the second Ti layer 44, the suction-preventing layer 40, and the first Ti layer 42 on the insulating layer 20 are selectively removed. Thus, upper interconnects 34 are completed.

Since the suction-preventing layer 40 formed out of TiN by CVD exists, even if the base layer 10 is preliminarily heated, the lower metallization layer 12 at the bottoms of the openings 22 is prevented from rising. Also, since the metallization material that is aluminum or an aluminum alloy is fluidized, even if the base layer 10 is heated to a high temperature, the material of the lower metallization layer 12 is prevented from being sucked into the overlying contact holes 32.

Instead of forming the suction-preventing layer 40 out of TiN, the layer may be formed out of W by CVD. The surface of the W layer formed in this way can be nitrided. Furthermore, the suction-preventing layer 40 can be fabricated from WN by CVD.

In Examples 1–5, if the suction-preventing layer 40 is annealed after formation of this layer 40, then the ability of this layer 40 to prevent the metallization material from being sucked is enhanced. The annealing processing can be done by furnace annealing, rapid thermal annealing (RTA) using lamp heating, or other method. For example, the annealing can be carried out by furnace annealing under the following conditions:

heating temperature: 500° to 600° C.

heating time: 30 to 60 minutes process gases: $N_2/O_2=8/2$ liters

Alternatively, the annealing can be performed by RTA under the following conditions:

heating temperature: 500° to 600° C.

heating time: 1 to several minutes process gases: $N_2=5$ liters

The upper limit of the heating temperature is so set that the metallization material, or aluminum or an aluminum alloy, of the lower metallization layer 12 is not melted.

The annealing improves the crystal orientation in the suction-preventing layer 40 and enhances its performance. In addition, oxygen atoms enter the crystal grain boundaries in the suction-preventing layer 40, thus enhancing its performance.

After the annealing processing described above, a second Ti layer 44 or a film of the metallization material can be formed on the annealed layer by high-temperature aluminum sputtering or an aluminum reflow method.

EXAMPLE 6

Example 6 pertains to a multilayer interconnect structure and a method of fabricating such a structure according to the second embodiment of the invention. In Examples 1–5, the suction-preventing layer 40 is formed at the bottoms of the contact holes 32. In Example 6 described below, a suction-preventing layer 60 is formed on the surface of the lower metallization layer 12.

Figure 6A:
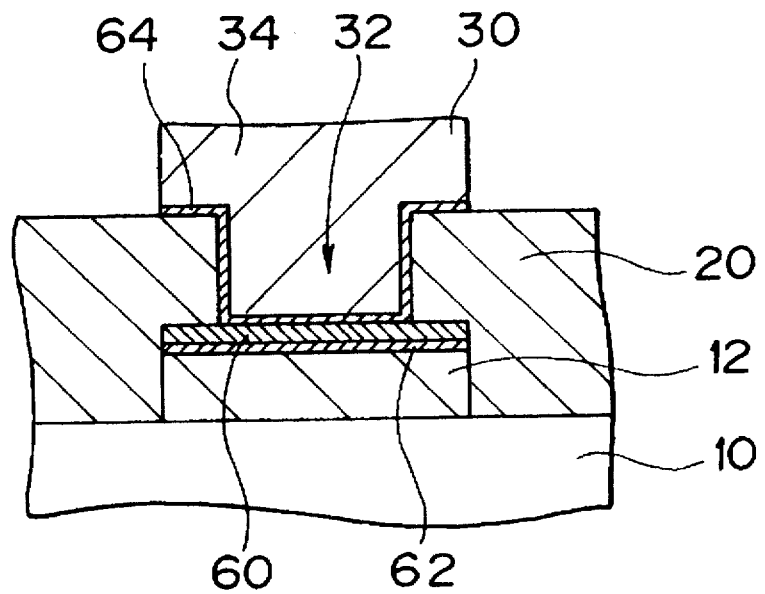
FIGS. 6A and 6B are schematic fragmentary cross sections of a semiconductor device having a multilayer interconnect structure of Example 6.

The multilayer interconnect structure of Example 6 is schematically shown in FIG. 6A and comprises a lower metallization layer 12 formed on a base layer 10, an insulating layer 20 coated on the lower metallization layer 12, an upper metallization layer 30 formed on the insulating layer 20, and contact holes 32 formed in the insulating layer 20. The lower metallization layer 12 and the upper metallization layer 30 are made of aluminum or an aluminum alloy. The contact holes 32 are also made of aluminum or an aluminum alloy and serves to electrically interconnect the lower metallization layer 12 and the upper metallization layer 30. A suction-preventing layer 60 is formed on the surface of the lower metallization layer 12 to prevent the material of the lower metallization layer from being sucked into the overlying contact holes.

The base layer 10 consists of an insulating bottom layer. In Example 6, the suction-preventing layer 60 is fabricated out of TiN by sputtering. The upper metallization layer 30 and the contact holes 32 are formed by high-temperature aluminum sputtering. A method of fabricating the multilayer interconnect structure of Example 6 is next described by referring to FIGS. 7A to 7C, which are schematic fragmentary cross sections of a semiconductor device.

Step-600

The base layer 10 is made of an insulating bottom layer consisting of $SiO_2$ deposited on a semiconductor substrate (not shown). The lower metallization layer 12 is formed by the prior art sputtering method, using a single wafer processing magnetron sputtering machine. The lower metallization layer 12 is made of aluminum or an aluminum alloy, e.g., Al-1% Si. The thickness of the lower metallization layer 12 is 600 nm.

Step-610

Then, TiN is sputtered on the lower metallization layer 12 to form the suction-preventing layer 60. Before the formation of this layer 60, it is desired to form a Ti film 62 on the lower metallization layer 12, for reducing the contact resistance between the suction-preventing layer 60 and the lower metallization layer 12. For example, the Ti layer 62 can be formed to a thickness of 10 to 30 nm by sputtering under the following conditions:

process gas: Ar=100 sccm

DC power: 4 kW pressure: 0.4 Pa base layer temperature: 150° C.

Figure 7A:
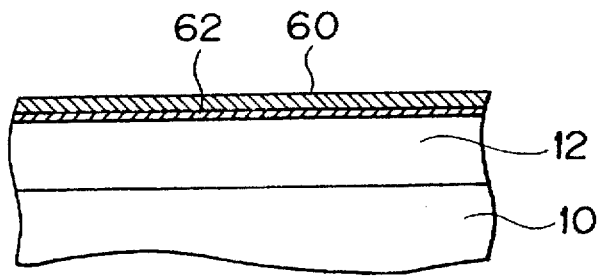
FIGS. 7A to 7C are schematic fragmentary cross sections of the semiconductor device shown in FIGS. 6A and 6B, illustrating the process sequence of Example 6.

Subsequently, TiN is sputtered on the Ti layer 62 to form the suction-preventing layer 60 (FIG. 7A). For example, TiN can be sputtered to a thickness of 40 nm to form the suction-preventing layer 60 under the following conditions:

process gases: $Ar/N_2=30/70$ sccm

DC power: 5 kW pressure: 0.4 Pa base layer temperature: 150° C.

This suction-preventing layer 60 acts to prevent the aluminum material or aluminum alloy material of the lower metallization layer 12 from being sucked into contact holes formed later. In addition, during the patterning of the lower metallization layer, the suction-preventing layer 60 acts as an antireflection film for preventing reflection of exposing light. Therefore, the thickness of the suction-preventing layer 60 of TiN should be selected so as to make full use of these functions. Preferably, the thickness is set to about 20 to 70 nm.

Figure 7B:
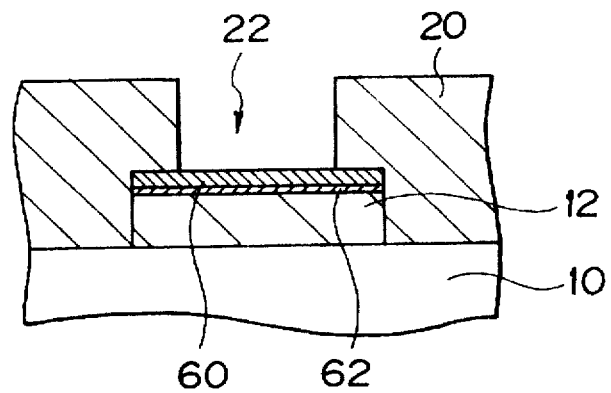

Then, the lower metallization layer 12 having the suction-preventing layer 60 on its surface is photolithographically patterned to form desired interconnections. Thereafter, an insulating layer 20 having a thickness of 0.5 µm is fabricated out of $SiO_2$ on the lower metallization layer 12 by an ordinary CVD process. Then,. openings are formed in the insulating layer 20 over the lower metallization layer 12 by dry etching (FIG. 7B). The diameter of each opening is 0.7 µm. For example, the dry etching step can be performed under the same conditions as in step-100 of Example 1.

Step-620

Then, an upper metallization layer 30 is formed out of aluminum or an aluminum alloy on the insulating layer 20 by sputtering. This material is buried in the openings 22 to form contact holes 32 for electrically interconnecting the lower metallization layer 12 and the upper metallization layer 30. For this purpose, the semiconductor substrate is first preliminarily heated to 500° C. for 1 minute. In this way, gases consisting mainly of $H_2O$ are released from the insulating layer 20. Then, a Ti layer 64 having a thickness of 100 nm is formed over the whole surface of the insulating layer 20 including the openings 22 by sputtering, using a single wafer processing magnetron sputtering machine. This Ti layer 64 acts to improve the electrical conduction between the lower metallization layer 12 and the contact holes 32. The Ti layer 64 can be formed under the same condition as the conditions under which the Ti layer 62 is formed in step-610.

Figure 7C:
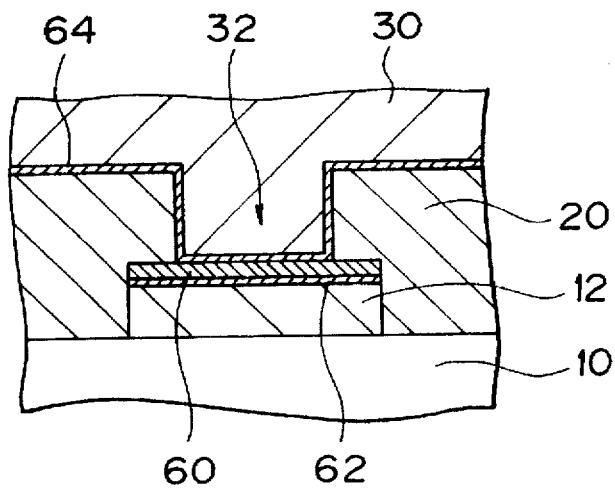

Thereafter, aluminum or an aluminum alloy, e.g., Al containing 1% silicon, is deposited on the Ti layer 64 (FIG. 7C). The thickness of the metallization material on the insulating layer 20 is 600 nm. In this high-temperature aluminum sputtering method, the temperature of the base layer 10 is controlled to a temperature between 400° C. and the melting point of the metallization material. The metallization material deposited on the insulating layer 20 is fluidized and flows into the openings 22. This assures that the metallization material is buried in the openings 22.

The high-temperature aluminum sputtering can be performed under the same conditions, for example as in step-120 of Example 1. The upper metallization layer may be formed by the aluminum reflow method described in step-220 of Example 2 instead of the high-temperature aluminum sputtering.

In this way, the upper metallization layer 30 is formed out of aluminum or an aluminum alloy on the insulating layer 20. At the same time, the material is buried in the openings 22, whereby the contact holes 32 electrically interconnecting the lower metallization layer 12 and the upper metallization layer 30 are formed.

Step-630

Figure 6B:
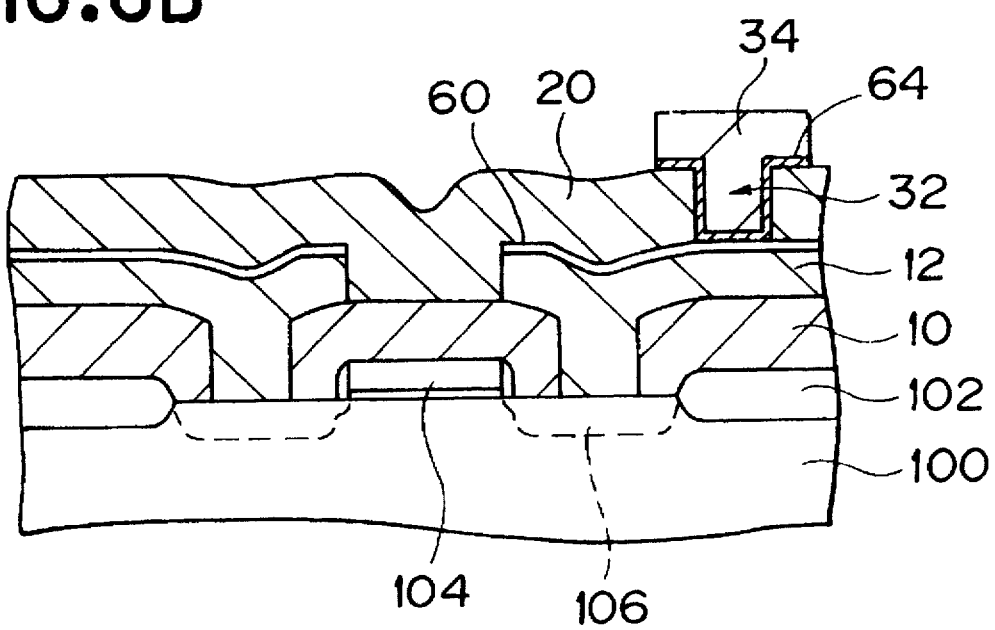

Then, the upper metallization layer 30 and the Ti layer 64 on the insulating layer 20 are selectively removed. Thus, upper interconnects 34 are completed (FIG. 6A). FIG. 6B is a schematic fragmentary cross section of a semiconductor device including a semiconductor substrate and a lower metallization layer. Shown in FIG. 6B are the semiconductor substrate, indicated by 100, a device-isolating region 102, a gate electrode portion 104, and source/drain regions 106. The Ti layer 62 is not shown.

Since the suction-preventing layer 60 of TiN is formed on the surface of the lower metallization layer 12, even if the base layer 10 is preliminarily heated, the lower metallization layer 12 at the bottoms of the openings 22 is prevented from rising. Also, the layer 60 prevents the material of the lower metallization layer 12 from being sucked into the overlying contact holes 32, even if the base layer 10 is heated to a high temperature.

The suction-preventing layer 60 can be formed out of TiON, TiW, W, and WN by sputtering, as well as out of TiN. The layer 60 can be formed out of these materials under the following conditions:

material: TiON
process gases: $Ar/N_2$-6% $O_2$=30/70 sccm
DC power: 5 kW
pressure: 0.4 Pa
base layer temperature: 150° C.

material: TiW
process gas: Ar=100 sccm
DC power: 5 kW
pressure: 0.4 Pa
base layer temperature: 150° C.

material: W
process gas: Ar=80 sccm
DC power: 3 kW
pressure: 0.4 Pa
base layer temperature: 150° C.

material: WN
process gas: Ar=100 sccm
DC power: 5 kW
pressure: 0.4 Pa
base layer temperature: 150° C.

Where the suction-preventing material is made of TiON, TiW, W, or WN, the thickness is about 30 to 150 nm.

Figure 8:
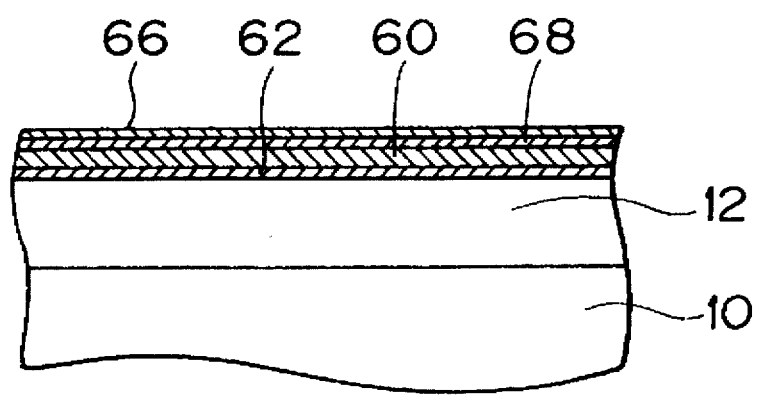
FIG. 8 is a schematic fragmentary cross section of the lower metallization layer of a modification of Example 6.

Alternatively, a Ti layer 66 having a thickness of 10 nm and a TiON layer 68 having a thickness of 30 nm may be formed in succession on the suction-preventing layer 60 by sputtering as shown in FIG. 8 after the suction-preventing layer 60 is formed and before formation of the insulating layer 20. The Ti layer 66 further reduces the contact resistance between the lower metallization layer 12 and the contact holes 32. The TiON layer 68 further enhances the antireflective function when the lower metallization layer is patterned. The Ti layer 66 and the TiON layer 68 can be formed under the same condition as the Ti layer and the TiON layer of the previous examples.

In Example 6, if the suction-preventing layer 60 is annealed after the formation of the layer 60, the ability of this layer to prevent suction of the metallization material is enhanced. The annealing processing can be done by furnace annealing, rapid thermal annealing (RTA) using lamp heating, or other method. For example, the annealing can be carried out by furnace annealing under the following conditions:

heating temperature: 500° to 600° C.
heating time: 30 to 60 minutes
process gases: $N_2/O_2$=8/2 liters Alternatively, the annealing can be performed by RTA under the following conditions:

heating temperature: 500° to 600° C.
heating time: 1 to several minutes
process gases: $N_2$=5 liters The upper limit of the heating temperature is so set that the metallization material, or aluminum or an aluminum alloy, of the lower metallization layer is not melted.

The annealing improves the crystal orientation in the suction-preventing layer 60 and enhances its performance.

Figure 9:
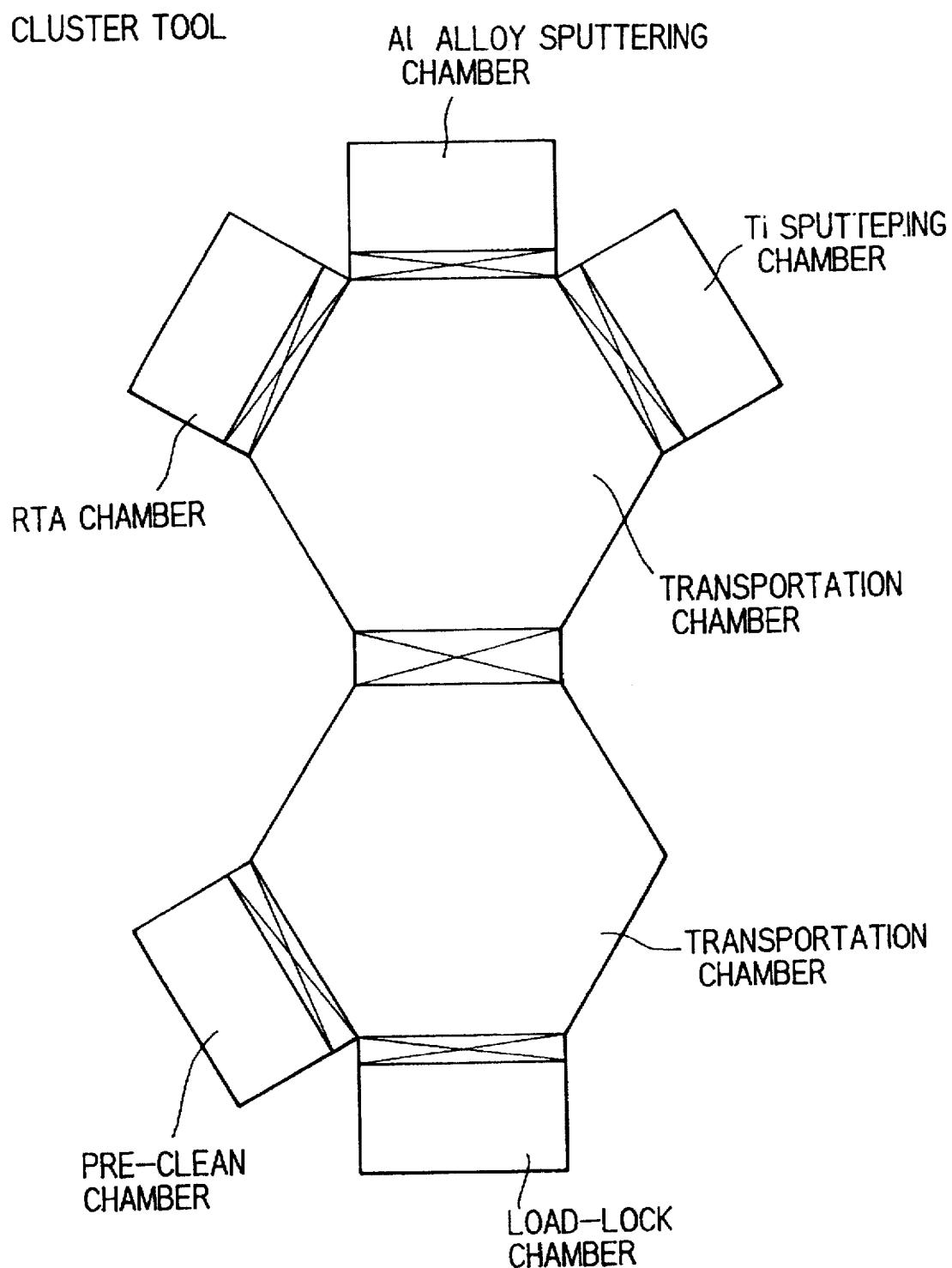
FIG. 9 is a schematic view of a multi-chamber machine adapted to be used in the present invention.
Figure 10A:
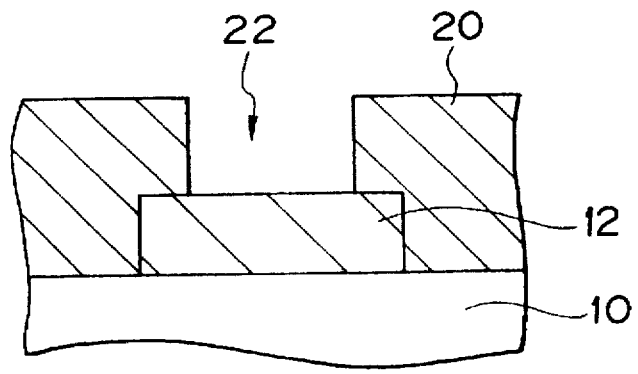
FIGS. 10A to 10C are schematic fragmentary cross sections of a semiconductor device, illustrating the prior art high-temperature aluminum sputtering method.
Figure 10B:
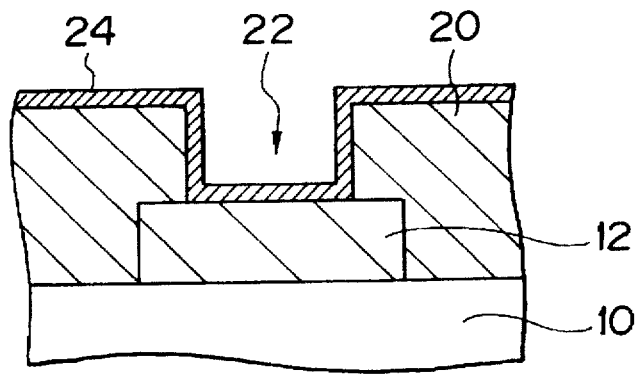
Figure 10C:
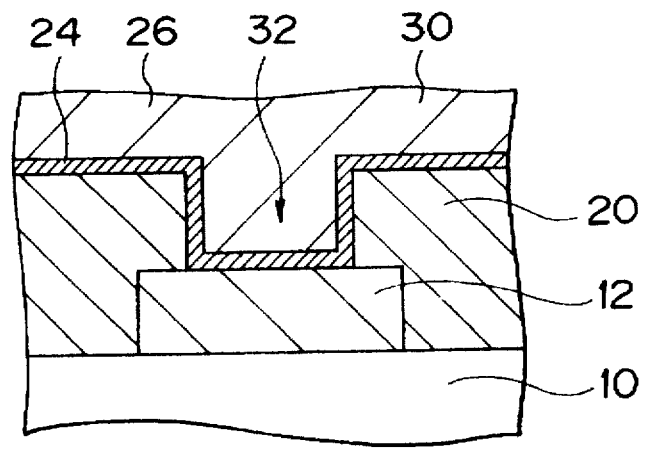
Figure 11A:
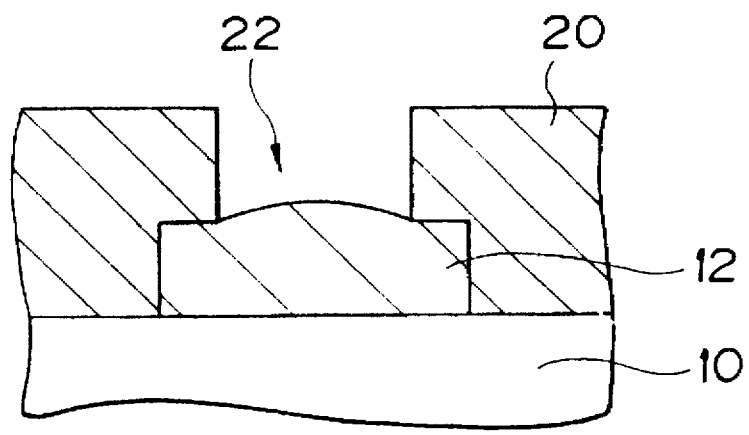
FIGS. 11A to 11B are schematic fragmentary cross sections of a semiconductor device, illustrating problems with the prior art high-temperature aluminum sputtering method or with the prior art aluminum reflow method.
Figure 11B:
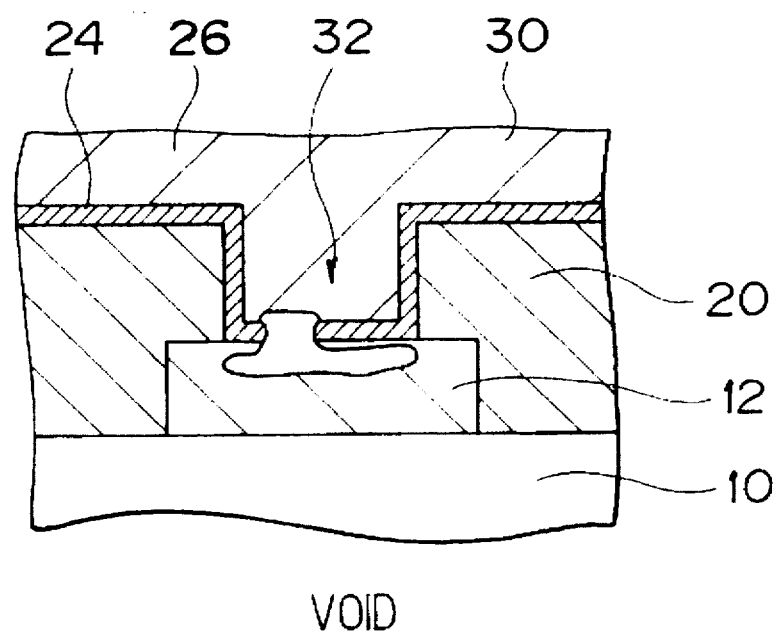

In addition, oxygen atoms enter the crystal grain boundaries in the suction-preventing layer 60, thus enhancing its performance. After performing the annealing in this way, an insulating layer 20 is formed on the annealed layer.

Where RTA using lamp heating is carried out, it is desired to use a multi-chamber system (a cluster tool) equipped with chambers for various sputtering processes and also with a chamber for RTA. The use of this machine makes it possible to perform successive RTA steps in a vacuum after the lower metallization layer 12, the suction-preventing layer 40 or 60, and other layers are formed. Neither the Ti layer nor the suction-preventing layer 40 or 60 is exposed to atmosphere. Hence, these layers are prevented from oxidizing. The multi-chamber system is schematically shown in FIG. 9.

While the present invention has been described in connection with its preferred embodiments, it is to be understood that the invention is not limited to these embodiments. The film formation conditions of the various examples and the numerical values given in the examples are merely exemplary and they can be modified appropriately. In the above examples, the insulating layer and the lower metallization layer 12 are made of $SiO_2$. The layers 20 and 10 may also be made of BPSG, PSG, BSG, AsSG, PbSg, SbSg, SiN, and other known insulating materials. Examples of the metallization material include pure aluminum, Al—Si—Cu, Al—Cu, Al—Ge, and other Al alloys, as well as Al-1% Si.

The formation of the various layers utilizing sputtering can be carried out by a DC sputtering machine, an RF sputtering machine, an ECR sputtering machine, a bias sputtering machine which applies a bias voltage to the substrate, and various other machines, as well as by a magnetron sputtering machine.

The multilayer interconnect structure and method of fabricating it according to the first and second embodiments of the invention can be combined. That is, the suction-preventing layer 60 is formed on the surface of the lower metallization layer 12. At the same time, the suction-preventing layer 40 can be formed at the bottoms of the openings.

In the present invention, a suction-preventing layer is formed either at the bottoms of contact holes or on the surface of a lower metallization layer to prevent the metallization material, or aluminum or an aluminum alloy, from being sucked into the overlying contact holes. Therefore, during preliminary heating, high-temperature aluminum sputtering, or aluminum reflow processing, the lower metallization layer is prevented from protuberating, or the material of the lower metallization layer is prevented from being sucked into the overlying contact holes. Hence, the reliability of the multilayer interconnect structure can be improved.

In the multilayer interconnect structure and method of fabricating it according to the second embodiment of the present invention, a suction-preventing layer is formed on the surface of a lower metallization layer and so even if contact holes are very fine or have a high aspect ratio, the ability to prevent suction is not deteriorated. When an upper metallization layer is formed, it is only necessary to form a Ti layer as a base layer on which the upper metallization layer is formed. This improves the characteristics of the metallization material buried in the openings.

What is claimed is:

1. A semiconductor device having a multilayer interconnect structure, comprising:
   a first metallization layer made of aluminum or aluminum alloy and formed on a base layer;
   an insulating layer formed on said first metallization layer and provided with at least one contact hole for exposing selected portions of said first metallization layer;
   a second metallization layer formed on said insulating layer and made of aluminum or aluminum alloy, said second metallization layer being patterned and connected with said first metallization layer via said at least one contact hole;
   a confinement layer between said first and second metallization layers for preventing said aluminum or aluminum alloy of said first metallization layer from moving into said at least one contact hole;
   a first metal layer formed between said first and second metallization layers and below said confinement layer to improve electrical conduction between said confinement layer and said first metallization layer; and
   a second metal layer formed between said first and second metallization layers and above said confinement layer to improve wettability with said aluminum or aluminum alloy material of said second metallization layer,
   wherein said confinement layer is formed at least at a bottom of said at least one contact hole, and
   further wherein said confinement layer is formed on and is co-terminus with said first metallization layer.

2. The semiconductor device of claim 1, wherein said first and second metal layers are made of titanium.

3. The semiconductor device of claim 1, wherein said confinement layer is made of at least one material selected from the group consisting of TiN, TiON, TiW, W, and WN.

4. The semiconductor device of claim 1, wherein said confinement layer is made of at least one material selected from the group consisting of Ti, W, nitrided Ti, oxidized Ti, nitrided W, and oxidized W.

5. The semiconductor device of claim 1, wherein said first metal layer is also formed on and is co-terminus with said first metallization layer.

6. The semiconductor device of claim 1, wherein said second metal layer follows a contour of said at least one contact hole.

7. A semiconductor device having a multilayer interconnect structure, comprising:
   a first metallization layer made of aluminum or aluminum alloy and formed on a base layer;
   an insulating layer formed on said first metallization layer and provided with at least one contact hole for exposing selected portions of said first metallization layer;
   a second metallization layer formed on said insulating layer and made of aluminum or aluminum alloy, said second metallization layer being patterned and connected with said first metallization layer via said at least one contact hole;
   a confinement layer between said first and second metallization layers for preventing said aluminum or aluminum alloy of said first metallization layer from moving into said at least one contact hole;
   a first metal layer formed between said first and second metallization layers and below said confinement layer to improve electrical conduction between said confinement layer and said first metallization layer; and
   a second metal layer formed between said first and second metallization layers and above said confinement layer to improve wettability with said aluminum or aluminum alloy material of said second metallization layer,
   and further comprising a TiON layer between said confinement layer and said second metal layer.

* * * * *